US009960242B2

(12) United States Patent
Wang

(10) Patent No.: US 9,960,242 B2
(45) Date of Patent: May 1, 2018

(54) REDUCED SIZE SPLIT GATE NON-VOLATILE FLASH MEMORY CELL AND METHOD OF MAKING SAME

(71) Applicant: Silicon Storage Technology, Inc., San Jose, CA (US)

(72) Inventor: Chunming Wang, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days. days.

(21) Appl. No.: 15/468,541

(22) Filed: Mar. 24, 2017

(65) Prior Publication Data
US 2017/0330949 A1    Nov. 16, 2017

(30) Foreign Application Priority Data

Apr. 8, 2016   (CN) .......................... 2016 1 0216805

(51) Int. Cl.
*H01L 29/66* (2006.01)
*H01L 29/423* (2006.01)
*H01L 27/11521* (2017.01)

(52) U.S. Cl.
CPC .. *H01L 29/42328* (2013.01); *H01L 27/11521* (2013.01)

(58) Field of Classification Search
CPC ................... H01L 29/42328; H01L 27/11521
See application file for complete search history.

(56) References Cited

U.S. PATENT DOCUMENTS

| 5,242,848 | A | 9/1993 | Yeh | |
|---|---|---|---|---|
| 6,747,310 | B2 * | 6/2004 | Fan | .................... H01L 27/11521 |
| | | | | 257/316 |
| 6,940,152 | B2 | 9/2005 | Arai | |
| 7,868,375 | B2 | 1/2011 | Liu | |
| 8,669,607 | B1 * | 3/2014 | Tsair | .................... H01L 29/7881 |
| | | | | 257/316 |
| 8,928,060 | B2 | 1/2015 | Tsair et al. | |
| 9,159,735 | B2 * | 10/2015 | Tsair | ..................... H01L 29/788 |
| 2006/0183284 | A1 * | 8/2006 | Sasago | ............... G11C 16/0491 |
| | | | | 438/257 |

* cited by examiner

*Primary Examiner* — Mark Tornow
(74) *Attorney, Agent, or Firm* — DLA Piper LLP (US)

(57) ABSTRACT

A reduced size non-volatile memory cell array is achieved by forming first trenches in an insulation layer in the row direction, filling the first trenches with insulation material, forming second trenches in the insulation layer in the column direction, forming the STI isolation material in the second trenches, and forming the source regions through the first trenches. Alternately, the STI isolation regions can be made continuous, and the source diffusion implant has sufficient energy to form continuous source line diffusions that each extend across the active regions and under the STI isolation regions. This allows control gates of adjacent memory cell pairs to be formed closer together.

3 Claims, 17 Drawing Sheets

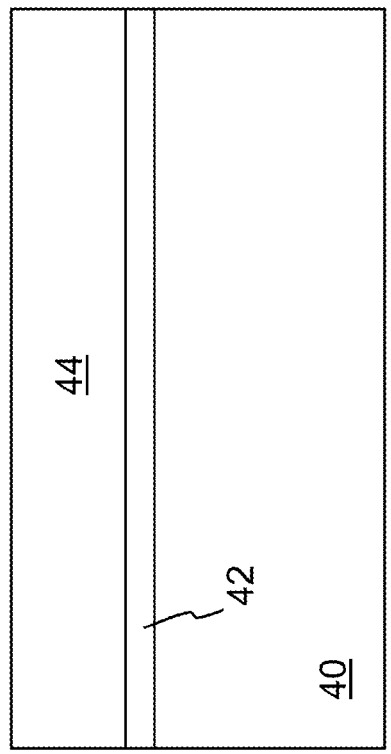
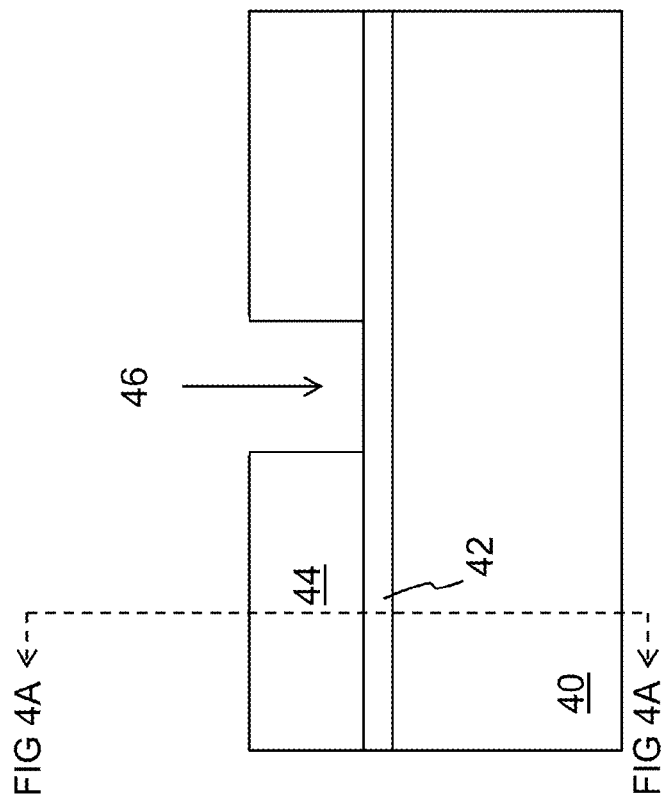
FIG. 4A
FIG. 3A

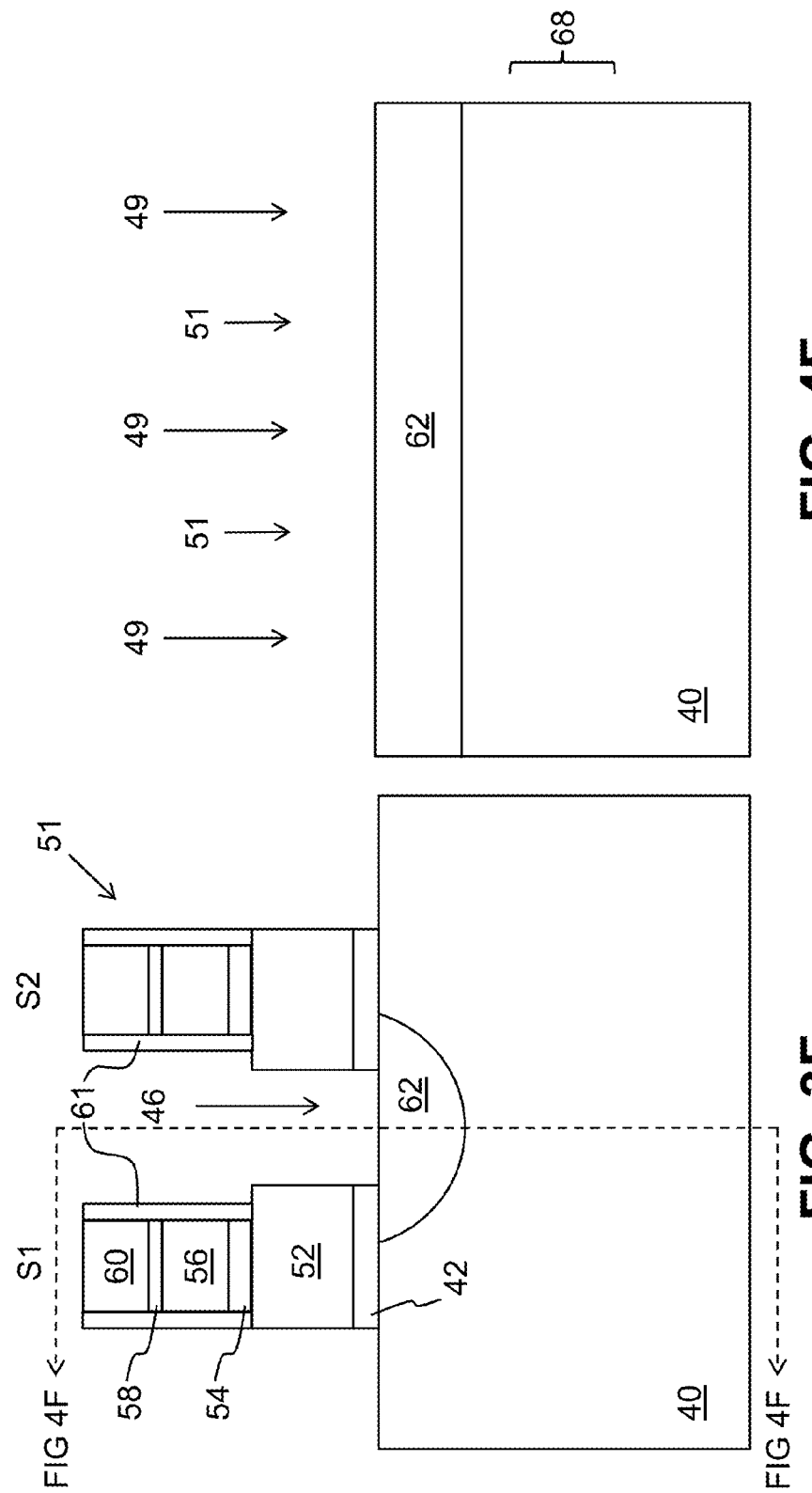

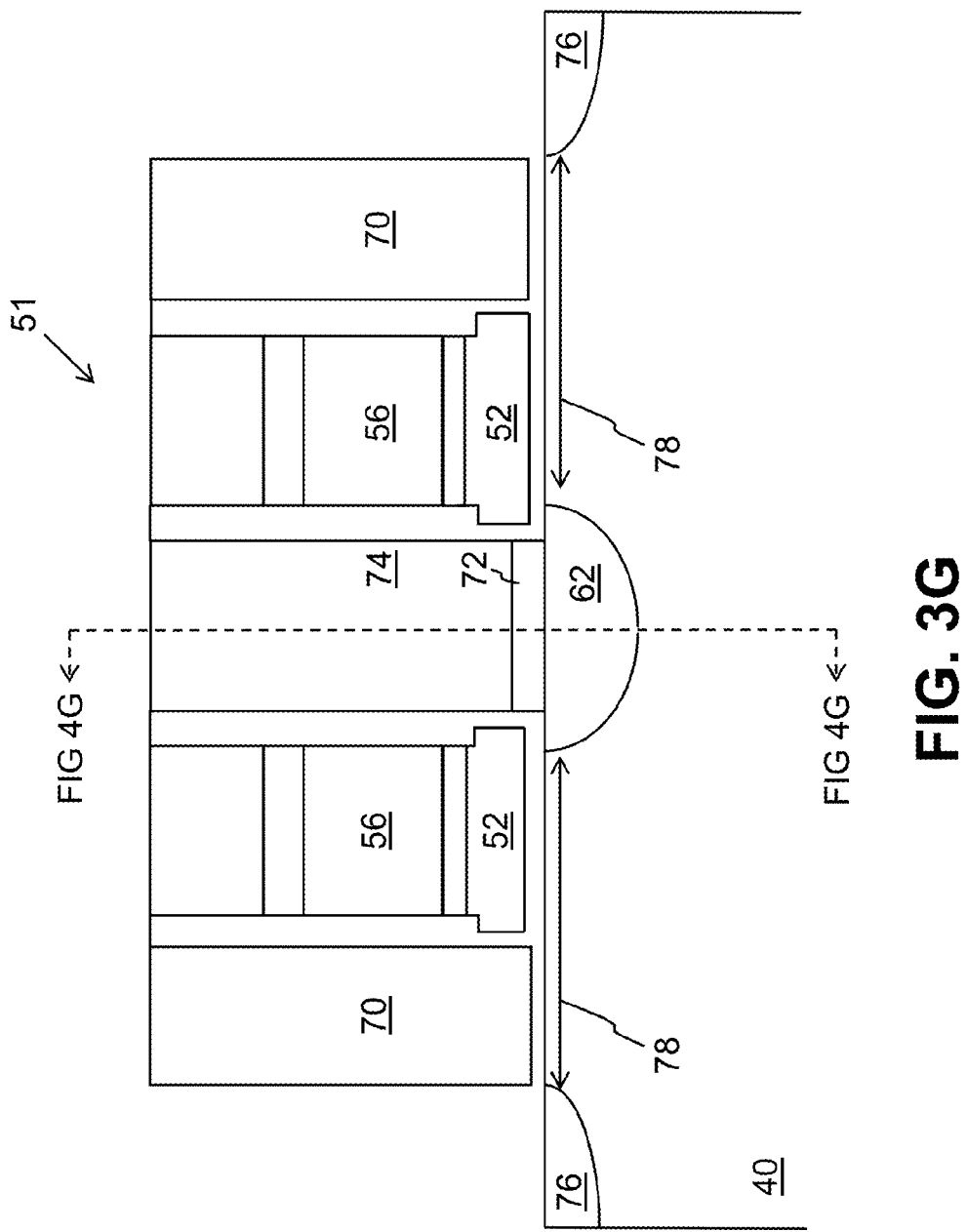

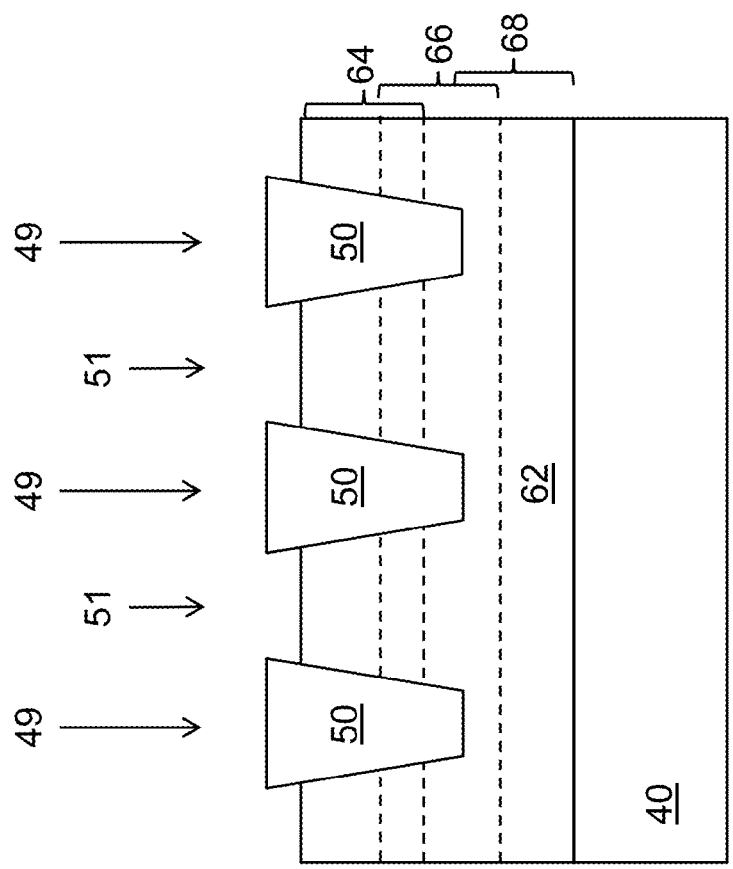
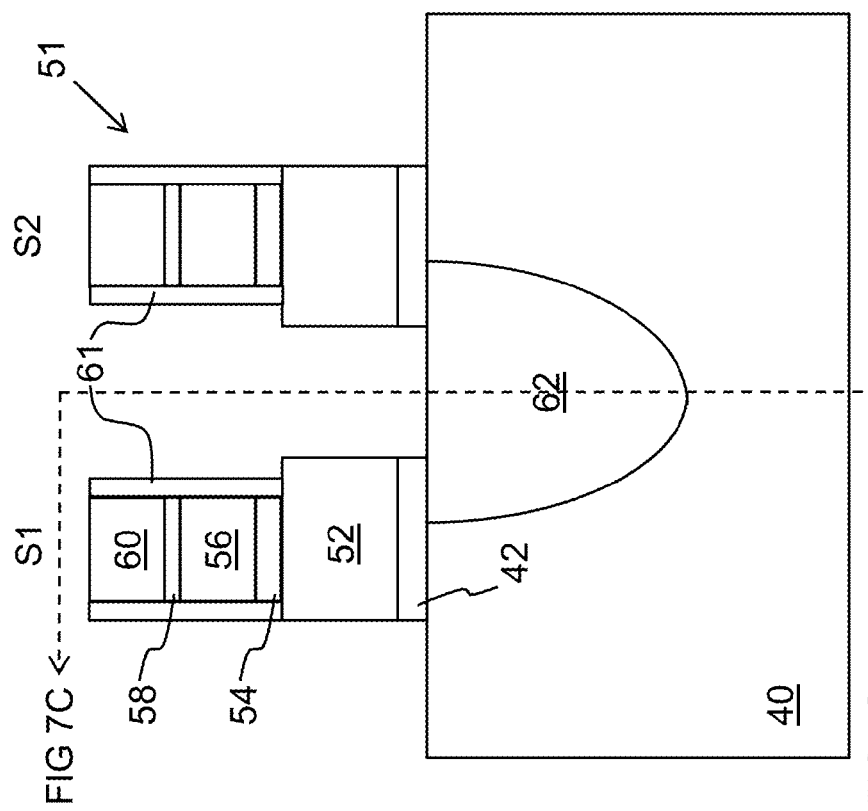

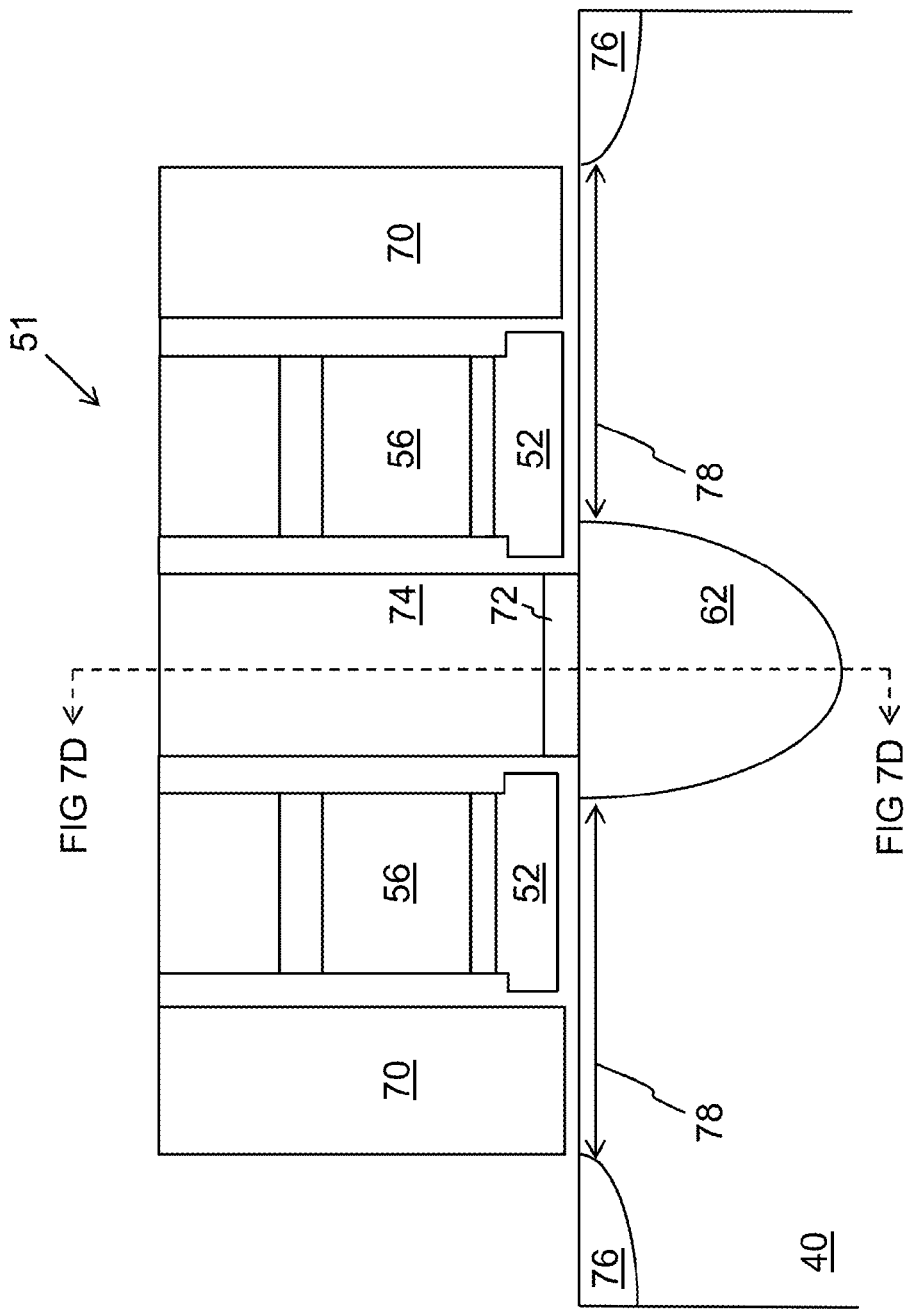

US 9,960,242 B2

REDUCED SIZE SPLIT GATE NON-VOLATILE FLASH MEMORY CELL AND METHOD OF MAKING SAME

RELATED APPLICATION

This application claims the benefit of Chinese Patent Application No. 201610216805.9 filed on Apr. 8, 2016, which is incorporated herein by reference

TECHNICAL FIELD

The present invention relates to a non-volatile flash memory cell which has a select gate, a floating gate, a control gate, and an erase gate.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. An erase gate having an overhang over the floating gate is also well known in the art. See for example, U.S. Pat. No. 5,242,848. All three of these patents are incorporated herein by reference in their entirety for all purposes.

FIG. 1 shows a conventional pair of memory cells formed on a semiconductor substrate 10. Each memory cell includes a floating gate 14 disposed over and insulated from the substrate 10 by an insulation layer 12 (e.g., silicon dioxide ("oxide")). A control gate 18 is disposed over and insulated from the floating gate 14 by an insulation layer 16 (e.g., ONO—oxide-nitride-oxide). Insulation layer 20 (e.g., silicon nitride ("nitride")) is disposed over the control gate 10. Insulation layer 22 (e.g., oxide) is disposed over the insulation layer 20. Insulation layer 24 (e.g., nitride) is disposed over the insulation layer 22. A select gate (word line gate) 26 is disposed over and insulated from the substrate 10, and is laterally adjacent to the floating gate 14 and control gate 18. Spaced apart source and drain regions 28 and 30 respectively are formed in the substrate (having a conductivity type different than that of the substrate (or a well formed in the substrate)). An erase gate 32 is formed over and insulated from the source region 28 by an insulation layer 34 (e.g., oxide).

FIG. 2 shows a top plan view of the array of such memory cells. Each row of control gates 18 are formed or connected as a single line extending in the row direction (i.e. electrically connecting the entire row of control gates 18). Each row of select (word line) gates 26 are formed or connected as a single line extending in the row direction (i.e. electrically connecting the entire row of select gates 26). The columns of memory cells are insulated from each other by isolation regions 36 that extend in the column direction. For example, the well-known technique of forming trenches into the substrate surface, and filling the trenches will insulation material such as STI oxide, can be used to form the isolation regions 36. Each row of source regions (shared by two adjacent memory cells in the column direction) are formed as a continuous diffusion region that extends in the row direction through gaps G between adjacent isolation regions 36 in the column direction (i.e. electrically connecting an entire row of source regions 28). A conductive erase gate line 32 (shown in phantom in FIG. 2) extends over the source region diffusion 28 and is also shared by two adjacent memory cells in the column direction.

As device geometries continue to shrink, it becomes more difficult to control the gap G between the ends of the STI oxide facing each other (through which the source line diffusion extends). Additionally, with this configuration, there is excessive space taken up by the source line 28 and erase gate line 32 in order to ensure a workable critical dimension of gap G between the ends of adjacent STI isolation regions 36 (in the column direction), especially given the line-end rounding of the STI oxide.

SUMMARY OF THE INVENTION

A reduced size non-volatile memory cell array is achieved with a semiconductor substrate having a plurality of parallel, continuous isolation regions each extending in a first direction, with an active region between each adjacent pair of the isolation regions, wherein each isolation region includes a trench formed into a surface of the substrate and insulation material disposed in the trench. A plurality of parallel, continuous source line diffusions are in the substrate each extending in a second direction orthogonal to the first direction, wherein each source line diffusion extends across each of the active regions and under the insulation material in each of the isolation regions. A plurality of memory cell pairs is formed in each of the active regions. Each of the memory cell pairs includes, a source region in the substrate which is a portion of one of the continuous source line diffusions, first and second drain regions in the substrate wherein a first channel region extends between the first drain region and the source region and a second channel region extends between the second drain region and the source region, a first floating gate disposed over and insulated from a first portion of the first channel region, a second floating gate disposed over and insulated from a first portion of the second channel region, a first select gate disposed over and insulated from a second portion of the first channel region, a second select gate disposed over and insulated from a second portion of the second channel region, a first control gate disposed over and insulated from the first floating gate, a second control gate disposed over and insulated from the second floating gate, and an erase gate disposed over and insulated from the source region.

A method of forming a non-volatile memory cell array includes forming a plurality of parallel, continuous isolation regions in a semiconductor substrate, wherein each of the continuous isolation regions extends in a first direction with an active region between each adjacent pair of the isolation regions, and wherein the formation of each of the isolation region includes forming a trench into a surface of the substrate and forming insulation material in the trench, forming a plurality of parallel, continuous source line diffusions in the substrate each extending in a second direction orthogonal to the first direction, wherein each source line diffusion extends across each of the active regions and under the insulation material in each of the isolation regions, and forming a plurality of memory cell pairs in each of the active regions. Each of the memory cell pairs includes a source region in the substrate which is a portion of one of the continuous source line diffusions, first and second drain regions in the substrate, wherein a first channel region extends between the first drain region and the source region and a second channel region extends between the second drain region and the source region, a first floating gate disposed over and insulated from a first portion of the first channel region, a second floating gate disposed over and insulated from a first portion of the second channel region, a first select gate disposed over and insulated from a second portion of the first channel region, a second select gate disposed over and insulated from a second portion of the second channel region, a first control gate disposed over and insulated from the first floating gate, a second control gate disposed over and insulated from the second floating gate, and an erase gate disposed over and insulated from the source region.

A method of forming a non-volatile memory cell array includes forming a layer of first insulation material on a semiconductor substrate, forming a plurality of first trenches in the layer of first insulation material that extend in a first direction, filling the plurality of first trenches with a second insulation material different than the first insulation material, forming a plurality of second trenches in the layer of first insulation material that extend in a second direction orthogonal to the first direction, extending the plurality of second trenches into the substrate, filling the plurality of second trenches with a third insulation material, wherein the third insulation material defines parallel isolation regions in the semiconductor substrate with an active region between each adjacent pair of the isolation regions, and wherein the isolation regions are not formed in the substrate under the plurality of first trenches, removing the second insulation material, forming a plurality of parallel, continuous source line diffusions in the semiconductor substrate by performing an implantation into the first trenches, wherein each source line diffusion extends in the first direction and across each of the active regions, and forming a plurality of memory cell pairs in each of the active regions. Each of the memory cell pairs includes a source region in the substrate which is a portion of one of the continuous source line diffusions, first and second drain regions in the substrate, wherein a first channel region extends between the first drain region and the source region and a second channel region extends between the second drain region and the source region, a first floating gate disposed over and insulated from a first portion of the first channel region, a second floating gate disposed over and insulated from a first portion of the second channel region, a first select gate disposed over and insulated from a second portion of the first channel region, a second select gate disposed over and insulated from a second portion of the second channel region, a first control gate disposed over and insulated from the first floating gate, a second control gate disposed over and insulated from the second floating gate, and an erase gate disposed over and insulated from the source region.

Other objects and features of the present invention will become apparent by a review of the specification, claims and appended figures.

BRIEF DESCRIPTION OF THE DRAWINGS

FIGS. 3A-3G are side cross sectional views, along the Y-column direction showing the formation of the pairs of memory cells of the present invention.

FIGS. 4A-4G are side cross sectional views, along the X-row direction showing the formation of the pairs of memory cells of the present invention.

FIGS. 6A-6D are side cross sectional views, along the Y-column direction showing the formation of the pairs of memory cells in an alternate embodiment of the present invention.

FIGS. 7A-7D are side cross sectional views, along the X-row direction showing the formation of the pairs of memory cells in the alternate embodiment of the present invention.

DETAILED DESCRIPTION OF THE INVENTION

The present invention is a non-volatile memory array and technique that utilizes two masking steps to reduce memory cell array size. A first horizontal masking step is used to etch a silicon nitride layer that will define the source line. A second vertical masking step is used to etch the silicon trench to isolate the neighboring bits. This technique can get right-angle STI corners at the source line, and avoid STI line-end rounding that results from conventional single mask STI formation. Thus, the space between two control gates can be reduced, thereby reducing memory cell array size. Alternately, memory cell array size can be achieved by one or more implants that penetrate the STI isolation regions, so that the source line diffusion extends underneath the continuous isolation region insulation.

Figure 1:
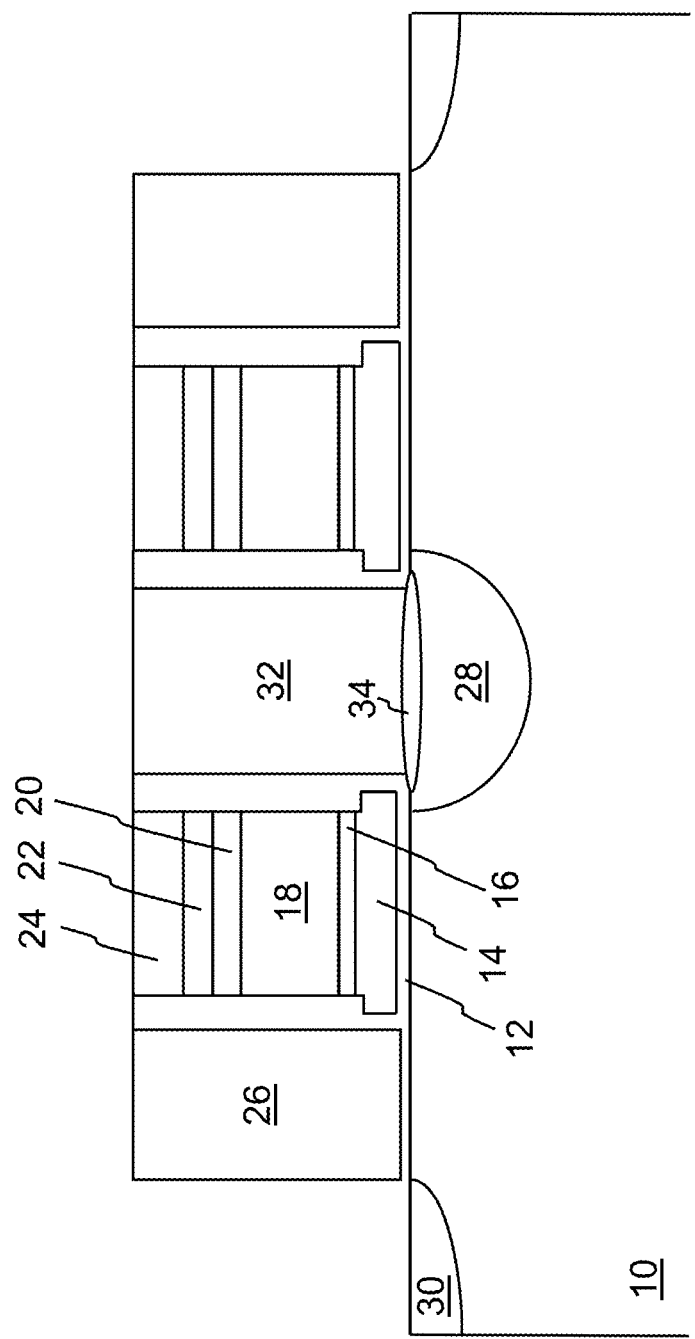
FIG. 1 is a cross sectional view of a pair of conventional non-volatile memory cells.
Figure 2:
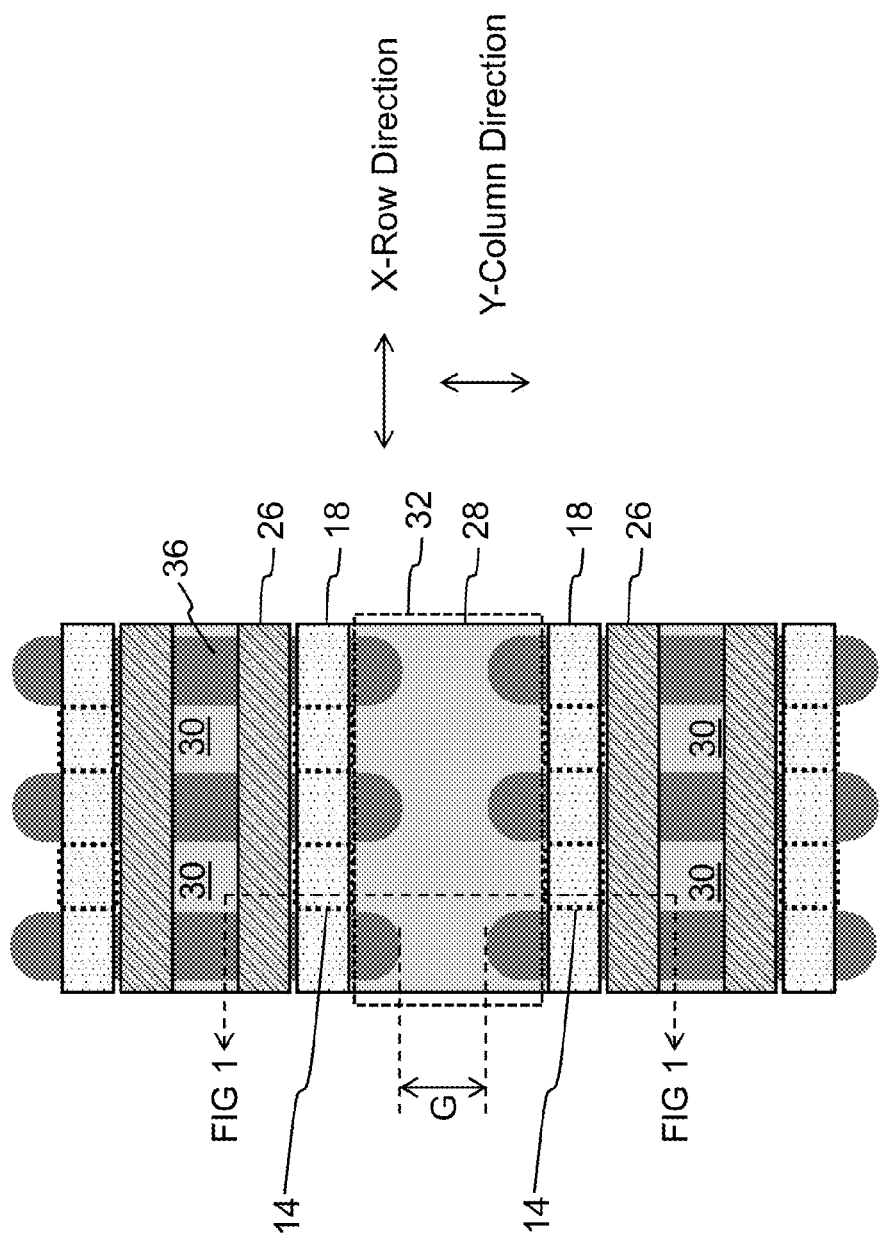
FIG. 2 is a top plan view of an array of the conventional non-volatile memory cells.
Figure 4B:
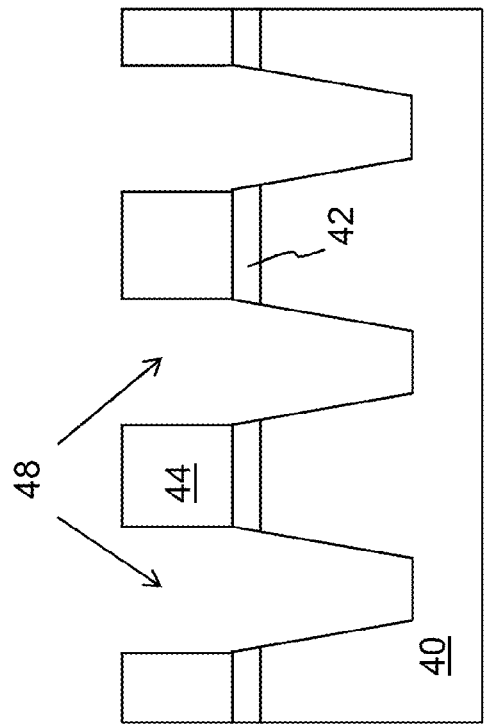
Figure 3B:
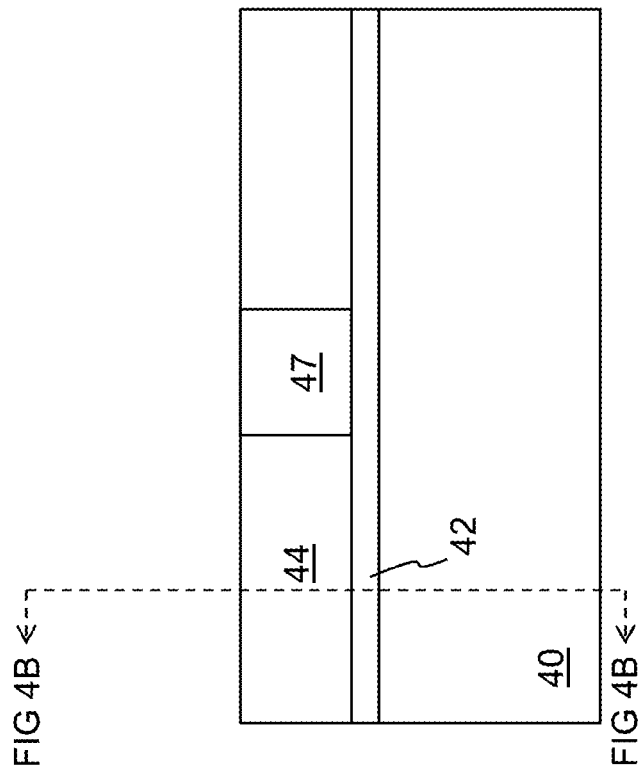

Referring to FIGS. 3A-3G and 4A-4G there are shown cross-sectional views (in the Y-column direction and the X-row direction, respectively) of the steps in the process to make a memory cell array of the present invention. The process begins by forming a layer of silicon dioxide (oxide) 42 on a silicon substrate 40. A layer of silicon nitride (nitride) 44 is then formed on the oxide layer 42. Photoresist material is coated on the structure, and a photolithography masking step is performed exposing selected portions of the photoresist material. The photoresist is developed and using the photoresist as a mask, the structure is etched such that trenches 46 are formed into the nitride layer 44 extending in the X-row direction, as shown in FIGS. 3A and 4A (after photo resist removal). Specifically, the nitride layer 44 is anisotropically etched until oxide layer 42 is exposed.

Figure 4C:
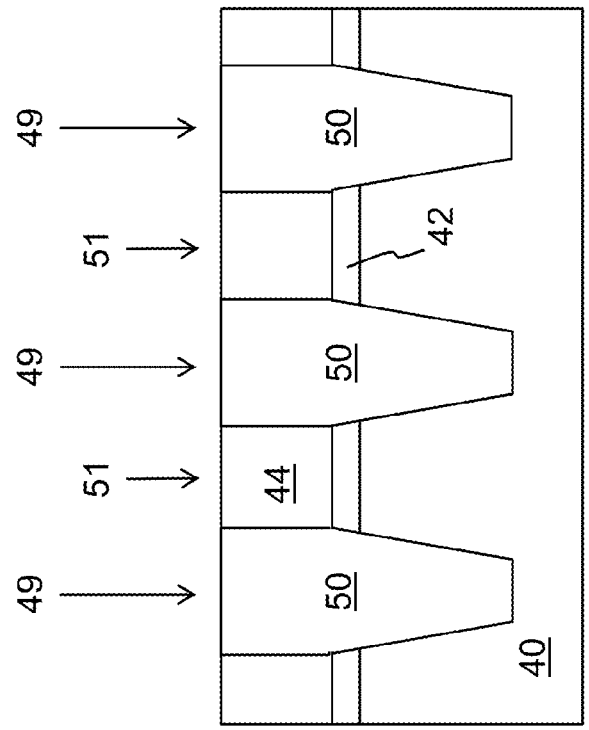
Figure 3C:
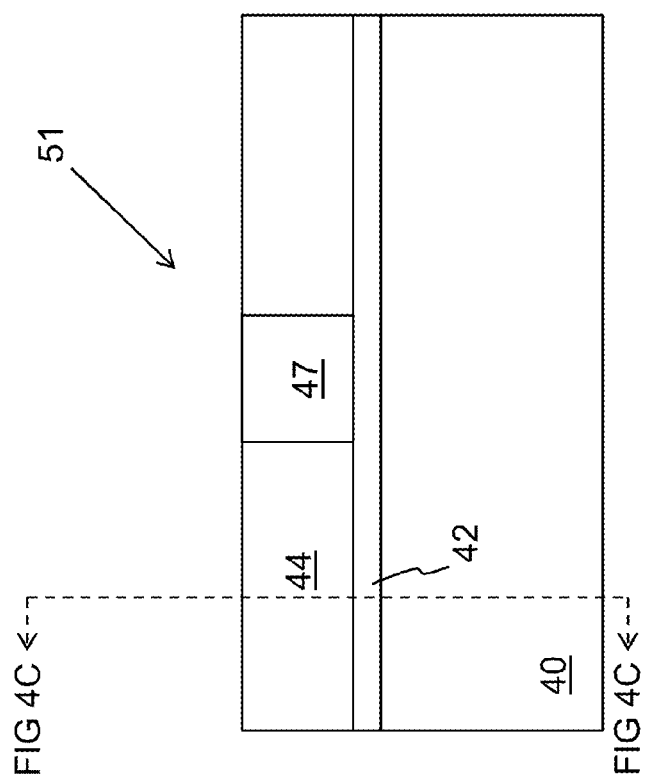

An oxide deposition and CMP or etch back is used to fill trenches 46 with oxide 47. Photoresist material is coated on the structure, and a photolithography masking step is performed exposing selected portions of the photoresist material. The photoresist is developed and selectively removed to leave portions of nitride layer 44 exposed. A nitride etch is then used form trenches 48 into the nitride layer 44 extending the Y-column direction. An anisotropic etch is used to etch the exposed oxide 42 and silicon 40 at the bottom of trenches 48 (i.e. extend trenches 48 through oxide layer 42 and into the substrate 40), as shown in FIGS. 3B and 4B (after photoresist removal). A thick layer of insulation material (e.g. oxide) is formed over the structure, filling trenches 48. A chemical-mechanical polish follows, using nitride 44 as an etch stop, leaving trenches 48 filled with STI oxide 50, as shown in FIGS. 3C and 4C. STI oxide 50 defines isolation regions 49 extending in the Y-column direction, and with active regions 51 there between (in an alternating fashion).

Figure 4D:
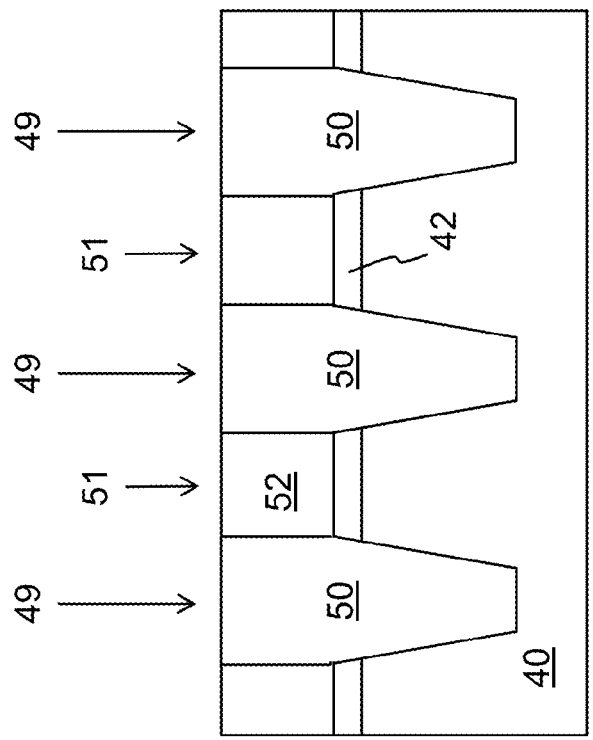
Figure 3D:
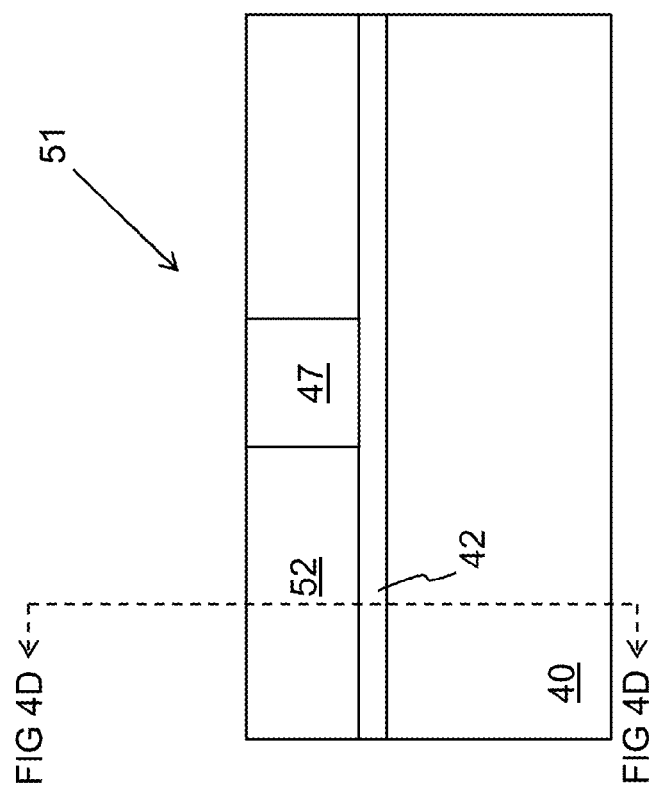
Figure 4E:
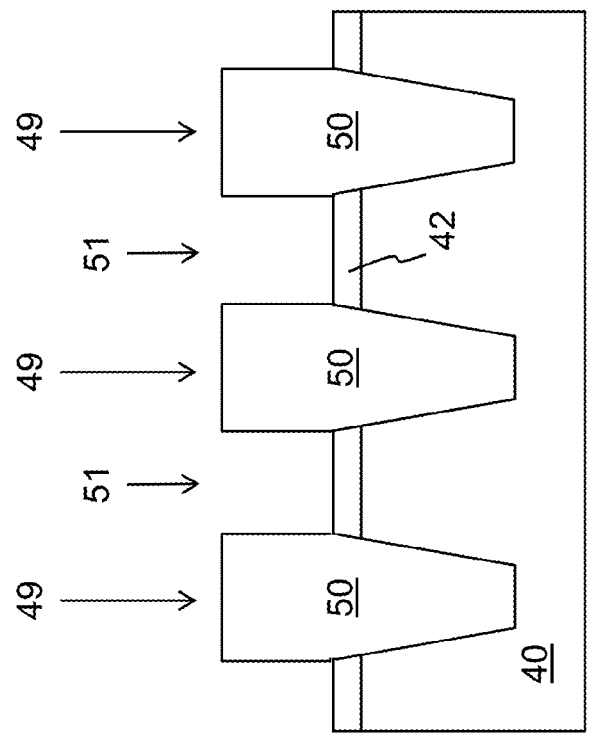
Figure 3E:
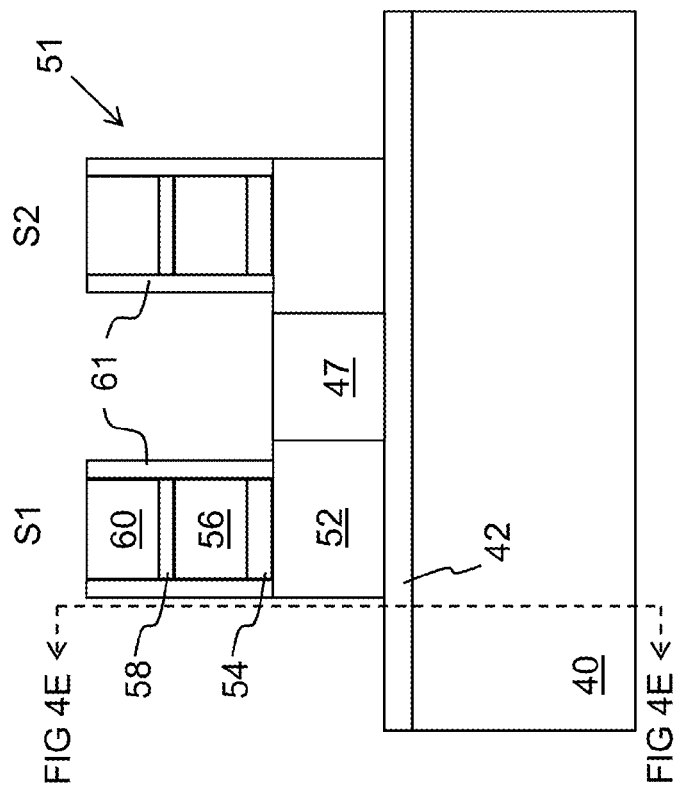

A nitride etch is used to remove nitride 44. Polysilicon (poly) is deposited on the structure, followed by a poly chemical mechanical polish (CMP) using oxide 47 and 50 as an etch stop (where poly layer 52 effectively replaces of nitride layer 44), as shown in FIGS. 3D and 4D. An insulation layer 54 (e.g. ONO, having oxide, nitride and oxide sublayers) is formed over the structure. A poly layer 56 is formed over the ONO layer 54. One or more insulation layers (e.g. oxide 58 and nitride 60) are formed over the poly layer 56. Photo resist is formed over the nitride layer 60, developed and selectively removed except for stripes running in the X-row direction. A series of etches are used to remove portions of the nitride 60, oxide 58, poly 56, and ONO 54 (except for the portions thereof protected by the stripes of photo resist), leaving pairs of stacks S1 and S2 of such layers in the active regions 51. After photo resist removal, insulation spacers 61 (e.g. nitride) are formed along the sides of stacks S1 and S2 (e.g. by nitride deposition and etch). Photoresist is formed partially over stacks S1 and S2 and the area in-between, but leaving the area outside of the pair of stacks S1 and S2 exposed. A poly etch is then used to remove the exposed portions of poly layer 52, as shown in FIGS. 3E and 4E (after removal of the photo resist).

An oxide etch is performed to remove oxide 47 and exposed portions of oxide 42 in the active regions 51, and the upper portions of oxide 50 in the isolation regions 49 (i.e. reduce the height of oxide 50 in the isolation regions 49). An implantation into trench 46 is used to form source region 62 in the substrate between stacks S1 and S2. The resulting structure is shown in FIGS. 3F and 4F.

Figure 4G:
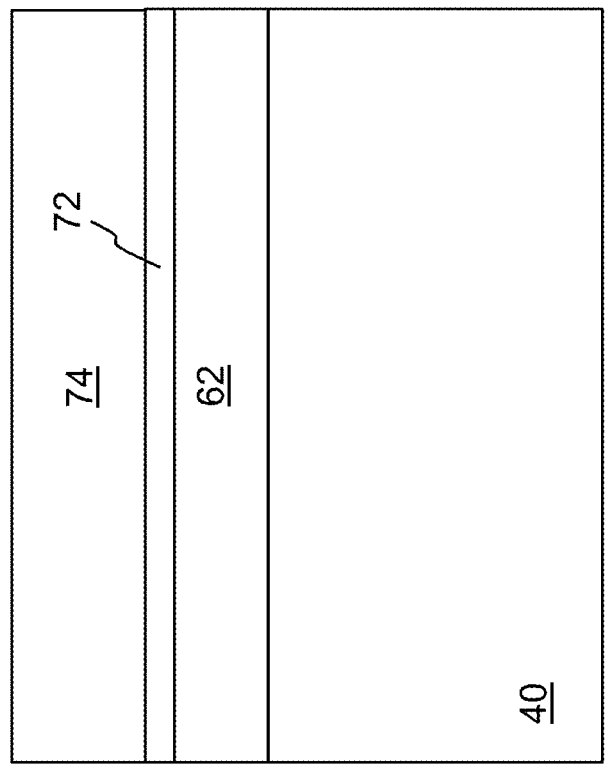

The memory cell formation is finished by forming select gates 70 adjacent to the floating gates 52 and control gates 56 over the floating gates 52 (by poly deposition and etch), forming oxide 72 on the substrate surface over the source regions 62, forming an erase gate 74 over the oxide 72 (by poly deposition and etch), and forming drain regions 76 in the substrate adjacent the select gates 70 through implantation. The final structure is shown in FIGS. 3G and 4G. The final configuration includes pairs of memory cells extending in the column direction end to end, each sharing a common source region 62. A channel region 78 extends between the source region 62 and drain region 76. Each memory cell has a floating gate 52 disposed over a first channel region portion, a select gate 70 disposed over a second channel region portion, and a control gate 56 disposed over the floating gate 52.

Figure 5:
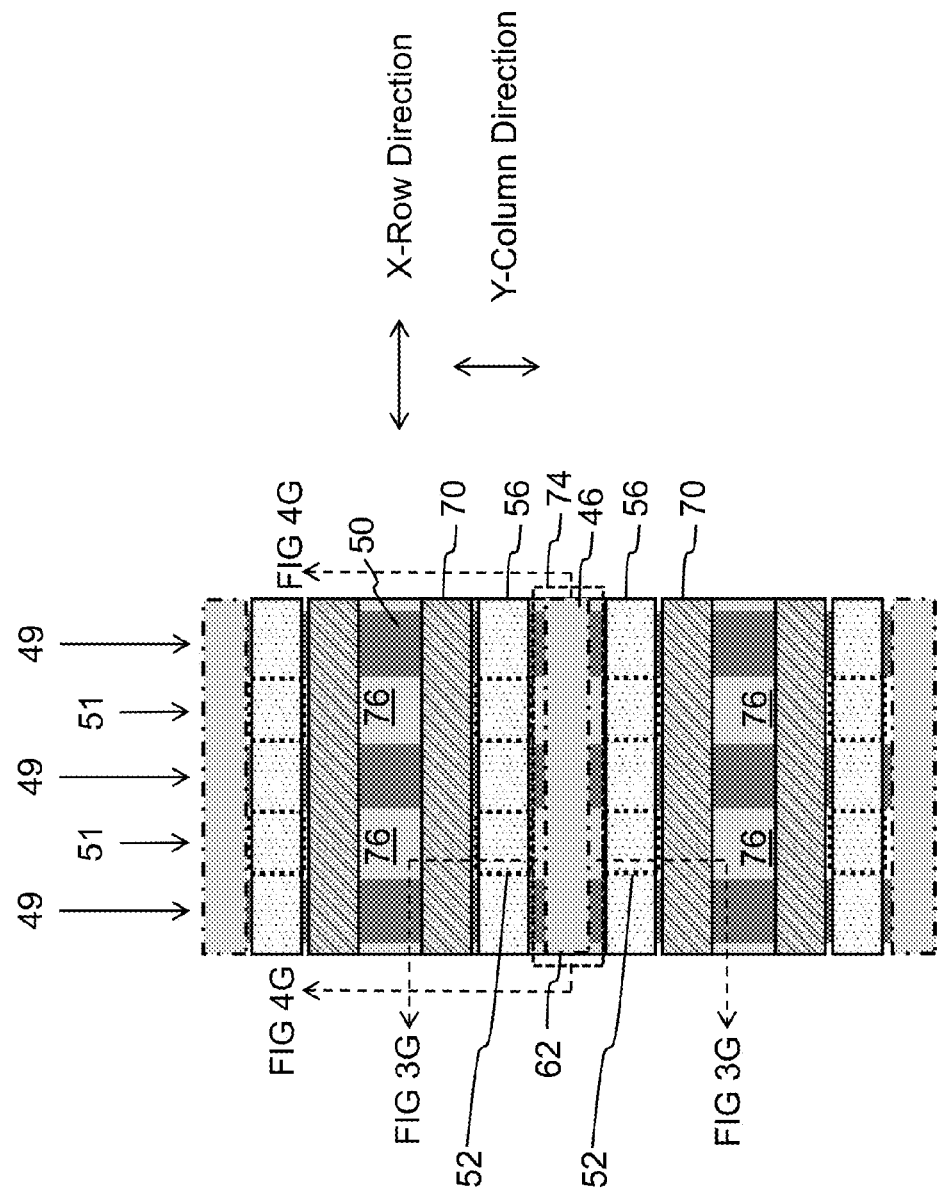
FIG. 5 is a top plan view of the non-volatile memory cell array of the present invention.

As shown in FIG. 5, the spacing needed for the source line 62 is reduced by having it defined by trench 46, allowing for reduced array size because adjacent control gate lines 56 can be closer together, better critical dimension control because the isolation regions 49 are formed as only line patterns, and no ending effect at a source line side of the isolation regions 49.

Figure 7A:
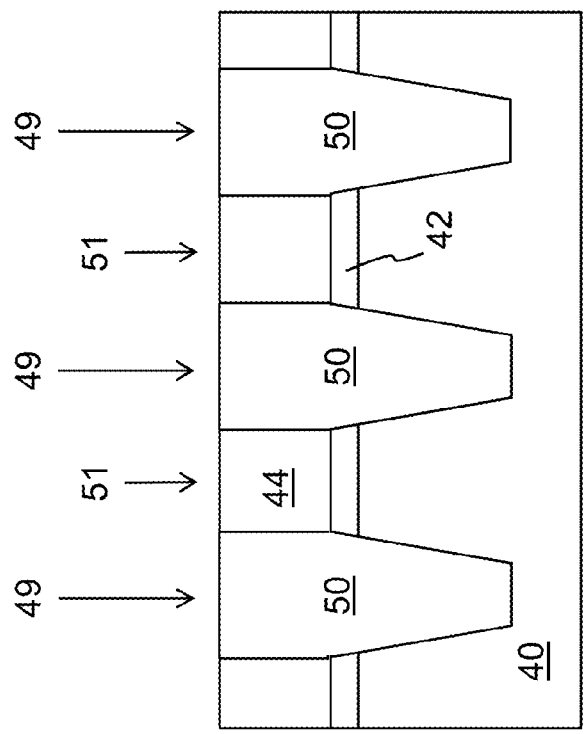
Figure 6A:
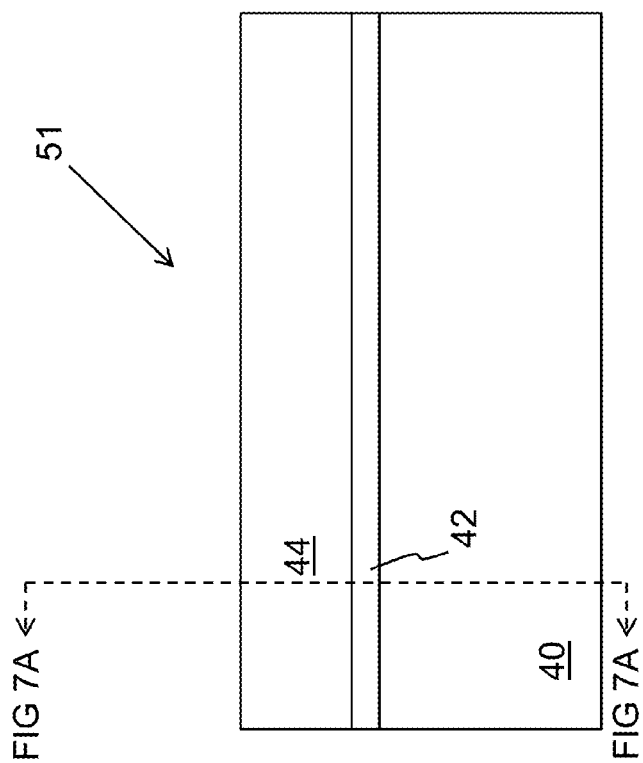
Figure 6B:
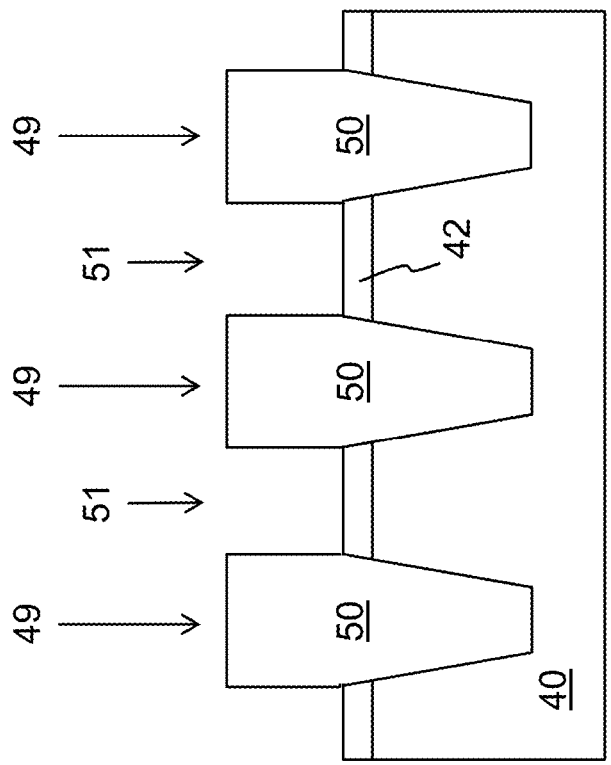
Figure 7B:
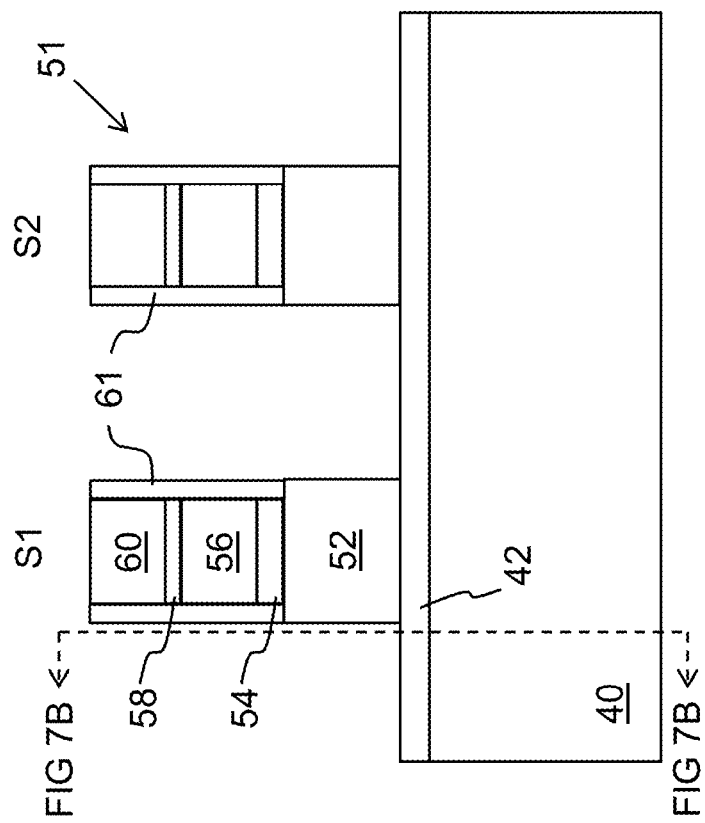
Figure 7D:
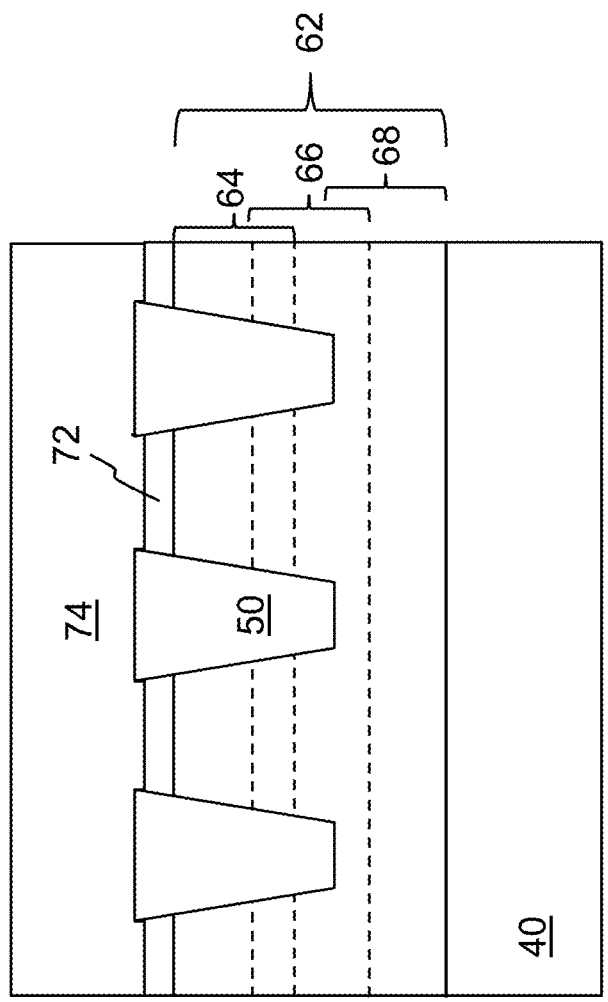
Figure 8:
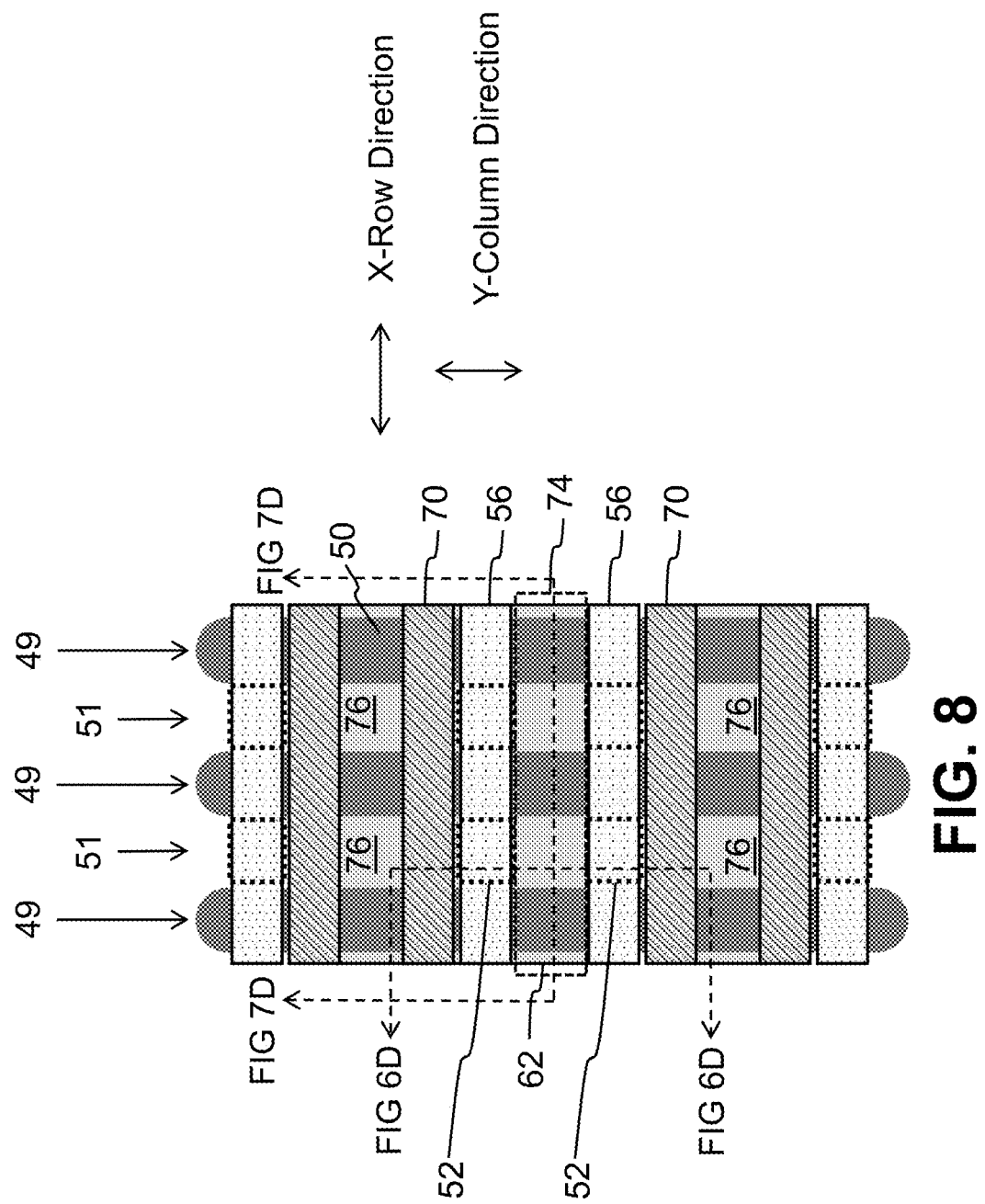
FIG. 8 is a top plan view of the non-volatile memory cell array of in the alternate embodiment of the present invention.

FIGS. 6A-6D and 7A-7D illustrate an alternate embodiment, in which continuous source lines are formed that extend under continuous STI oxide lines. Specifically, The processing described above with respect to FIGS. 3A-3B and 4A-4B is performed, except that trenches 46 are not formed (and thus oxide 47 is not formed). This results in continuous lines of STI oxide 50, as illustrated in FIGS. 6A and 7A. The processing continues as discussed above with respect to FIGS. 3C-3E and 4C-4E, resulting in the structure shown in FIGS. 6B and 7B (i.e. no oxide 47 between stacks S1 and S2). Source line 62 is then form using one or more implants having sufficient energy to penetrate the STI oxide 50 in the isolation regions 49, so parallel continuous source diffusions extending in the X-row direction across the active regions 51 and the isolation regions 49 (i.e., underneath STI oxide 50) are formed (i.e. all the source regions 62 which are part of the source diffusion for each row are connected together. In a preferred non-limiting embodiment, three separate implants can be performed, with a first implant having a first depth range 64, a second implant having a second depth range 66 extending deeper than the first depth range 64, and a third implant 66 having a third depth range 68 extending deeper than the first and second depth ranges 64/66, such that the source line formed extends continuously under the STI oxide 50 in the isolation regions 49, as illustrated in FIGS. 6C and 7C. The processing continues as described above with respect to FIGS. 3G and 4G, resulting in the final structure shown in FIGS. 6D and 7D. As shown in FIG. 8, this technique results in line patterns for isolation regions 49 and the source lines 62 extend underneath the STI oxide 50.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. For example, one or more of the source line implants can be performed earlier in the process (e.g., the first source line implant can occur after trenches 48 are formed, but before the STI oxide 50 is formed. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements therebetween, as well as forming the element indirectly on the substrate with one or more intermediate materials/elements therebetween.

What is claimed is:

1. A method of forming a non-volatile memory cell array comprising:
    forming a layer of first insulation material on a semiconductor substrate;
    forming a plurality of first trenches in the layer of first insulation material that extend in a first direction;
    filling the plurality of first trenches with a second insulation material different than the first insulation material;

forming a plurality of second trenches in the layer of first insulation material that extend in a second direction orthogonal to the first direction;

extending the plurality of second trenches into the substrate;

filling the plurality of second trenches with a third insulation material, wherein the third insulation material defines parallel isolation regions in the semiconductor substrate with an active region between each adjacent pair of the isolation regions, and wherein the isolation regions are not formed in the substrate under the plurality of first trenches;

removing the second insulation material;

forming a plurality of parallel, continuous source line diffusions in the semiconductor substrate by performing an implantation into the first trenches, wherein each source line diffusion extends in the first direction and across each of the active regions;

forming a plurality of memory cell pairs in each of the active regions, wherein each of the memory cell pairs includes:

a source region in the substrate which is a portion of one of the continuous source line diffusions, first and second drain regions in the substrate, wherein a first channel region extends between the first drain region and the source region and a second channel region extends between the second drain region and the source region, a first floating gate disposed over and insulated from a first portion of the first channel region, a second floating gate disposed over and insulated from a first portion of the second channel region, a first select gate disposed over and insulated from a second portion of the first channel region, a second select gate disposed over and insulated from a second portion of the second channel region, a first control gate disposed over and insulated from the first floating gate, a second control gate disposed over and insulated from the second floating gate, and an erase gate disposed over and insulated from the source region.

2. The method of claim 1, further comprising:

forming a layer of fourth insulation material directly on a surface of the semiconductor substrate, wherein the layer of first insulation material is formed directly on the layer of fourth insulation material.

3. The method of claim 1, wherein:

the first insulation material is nitride;

the second insulation material is oxide; and the third insulation material is oxide.

\* \* \* \* \*